(12) United States Patent
Dov et al.

(10) Patent No.: US 6,867,669 B2
(45) Date of Patent: Mar. 15, 2005

(54) APPARATUS AND METHOD TO FORM GROUND CONNECTIONS

(75) Inventors: Lewis R. Dov, Monument, CO (US); John F. Casey, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 99 days.

(21) Appl. No.: 10/601,463

(22) Filed: Jun. 23, 2003

(65) Prior Publication Data

US 2004/0257179 A1 Dec. 23, 2004

(51) Int. Cl.$^7$ ................................................ H01P 1/00
(52) U.S. Cl. ........................ 333/247; 333/246; 333/260
(58) Field of Search ................................ 333/246, 247, 333/260

(56) References Cited

U.S. PATENT DOCUMENTS

| | | | | |
|---|---|---|---|---|
| 4,360,865 A | * | 11/1982 | Yasumura et al. | .......... 363/126 |
| 5,334,962 A | * | 8/1994 | Higgins et al. | ............. 333/247 |
| 5,355,102 A | * | 10/1994 | Kornrumpf et al. | .......... 333/33 |
| 5,424,693 A | * | 6/1995 | Lin | ............................. 333/33 |
| 5,768,109 A | * | 6/1998 | Gulick et al. | ................ 361/794 |

* cited by examiner

*Primary Examiner*—Don Le

(57) ABSTRACT

Method and apparatus for interfacing a circuit, such as a microcircuit, with an IC. The circuit is formed on a thick film dielectric structure supported by a substrate having a cut out to receive the IC. A ground plane is formed on the substrate. The thick film dielectric structure abuts the cut out with an area having at least two projections forming at least one recess, the edge of the recess having a conductive layer in electrical communication with the ground plane. A conductive pad on top of the dielectric structure is in electrical communication with the conductive layer in the recess. A ground connection on the IC is connected to the conductive pad thereby grounding the IC.

20 Claims, 5 Drawing Sheets

APPARATUS AND METHOD TO FORM GROUND CONNECTIONS

BACKGROUND OF THE INVENTION

Microwaves are electromagnetic energy waves with very short wavelengths, typically ranging from a millimeter to 30 centimeters peak to peak. In high-speed communications systems, microwaves are used as carrier signals for sending information from point A to point B. Information carried by microwaves is transmitted, received and processed by microwave circuits.

Packaging of RF and microwave microcircuits has traditionally been very expensive. The packaging requirements are extremely demanding—very high electrical isolation and excellent signal integrity through gigahertz frequencies are required. Additionally, IC power densities can be very high. KQ dielectric materials from HERAESUS has found favor among designers of microcircuits because of its ability to provide such high electrical isolation while using more forgiving thick film processes.

One are in which the use of KQ has caused problems is the inability to create certain useful via structures. A typical layer of KQ is about 5 mils ($5/1000^{th}$ of an inch) thick. It is difficult to constructing vias through 5 mils of KQ that terminate on, but not pierce, a ground plane on top of a substrate. Another problem is that, to obtain a desired 50 ohm impedance in the signal path, the width of each via should be between 30 and 40 mils. An additional 20 mils of space is desirable to provide sufficient signal isolation. In the context of interconnecting an IC, this results in a rather large pitch. Accordingly, an interconnection scheme is needed that maximizes available real estate on the substrate.

The present inventors have recognized a need for method and apparatus for replicating the functionality of vias while maximizing the use of space on a substrate.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
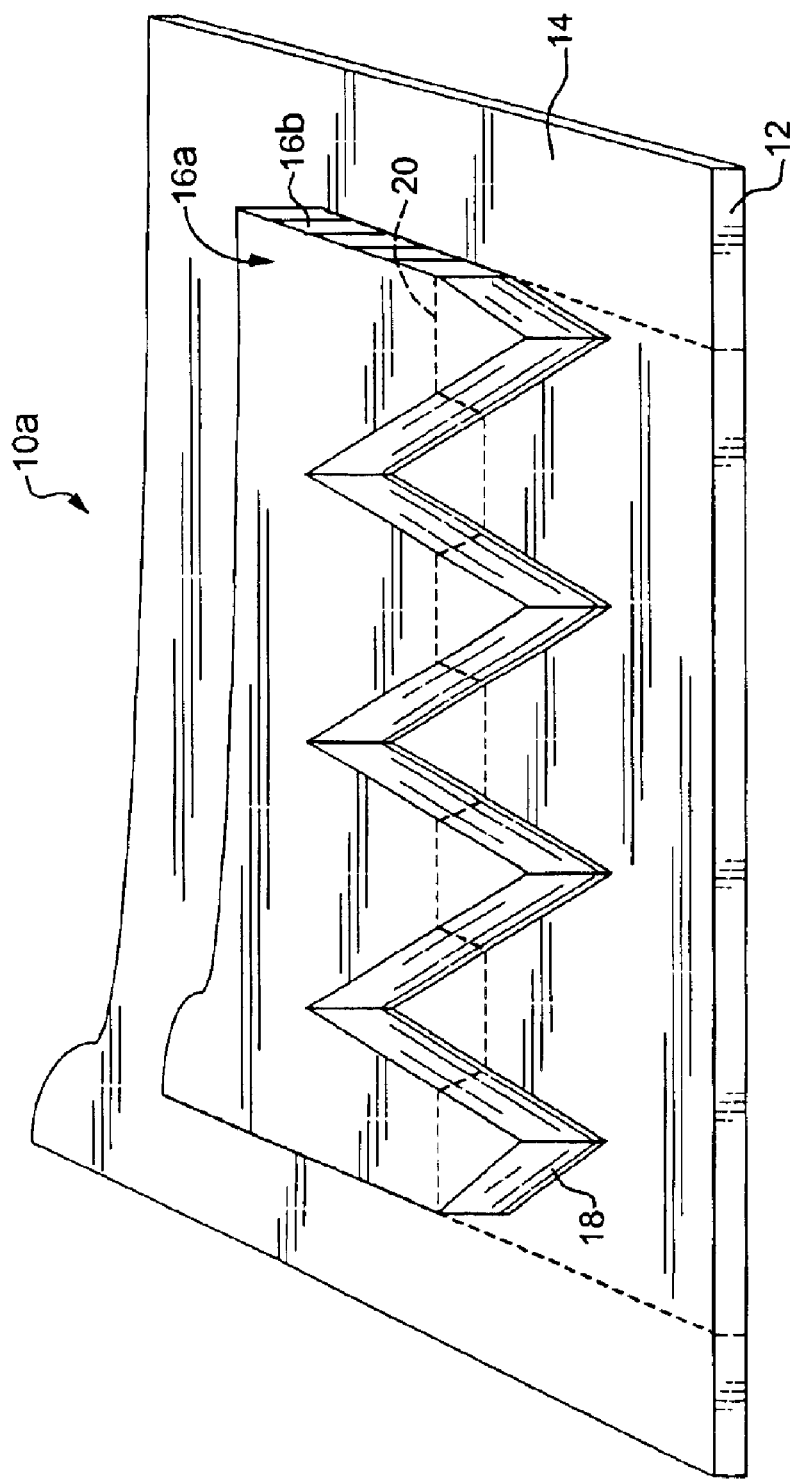
FIG. 1 is a conceptual diagram of a partially completed IC connection structure in accordance with the present invention.

Reference will now be made in detail to the present invention, examples of which are illustrated in the accompanying drawings, wherein like reference numerals refer to like elements throughout.

FIG. 1 is a conceptual diagram of a partially completed IC connection structure 10a in accordance with the present invention. It will be appreciated by those of ordinary skill in the relevant arts that the IC connection structure 10a, as illustrated in FIGS. 1 through 5 and the method of formation thereof as described hereinafter, is intended to be generally representative of such structures and that any given system may differ significantly from that shown in FIG. 1, particularly in the details of construction and operation of such system. More to the point, the structure illustrated in FIGS. 1 through 4 have been simplified to aid in explanation. For example, only a small portion of a typical IC connection structure constructed in accordance with the present invention is illustrated. Those of ordinary skill in the art will recognize that the exact configuration of any given IC connection structure will depend heavily upon the IC used along with the layout of other circuits in the system. As such, the IC connection structure 10n is to be regarded as illustrative and exemplary and not limiting as regards the invention described herein or the claims attached hereto.

The present invention provides methods and apparatus for the integration of an IC into a circuit, such as a microcircuit, formed on a layer of dielectric. Looking at FIG. 1, an IC connection structure 10a is supported by a substrate 12 upon which a ground plane 14 has been formed. The ground plane 14 is preferably formed of gold, but other materials known to those of ordinary skill in the art may be suitable. A dielectric layer 16 is formed on the substrate 14. The dielectric layer 16 may be a single layer or it may be built up with multiple layers. The dielectric layer supports at least one conductive trace (not shown) associated with a circuit to which an IC will be connected. The circuit may be a microcircuit.

In perhaps the preferred embodiment, the dielectric layer 16 is formed from a thick film paste that is applied and subsequently cured. Examples of suitable thick film dielectric materials that may be deposited as a paste and subsequently cured include the KQ 150 and KQ 115 thick film dielectrics from Heraeus and the 4141A/D thick film compositions from DuPont. These materials are primarily formulations of borosilicate glass containing small amounts of aluminum and magnesium. These products are applied as a paste, typically through a screen or stencil, and subsequently cured by the application of heat. They may be shaped at the time of application, before curing, or after curing by well known techniques (e.g., laser etching). These process are all described by the associated data sheets from the respective manufacturers. While the end result of using any of these products is essentially the same (a shaped region of controlled thickness and having a dielectric constant K of about 3.9) they have various ancillary differences that may be of interest to the designer. These include a change of color when cured, and an upward shift in softening temperature after an initial cure to facilitate structural stability during subsequent processing steps that require the re-application of heat to produce curing or processing of materials applied in those subsequent processing steps.

In the case of the present invention, the dielectric layer 16 is formed with an area 18, referred to herein as the connection area 18, of projections and recesses surrounding the desired location of the IC. Ideally, the connection area 18 is formed as a corrugated pattern, however, those of ordinary skill in the art will recognize that the shape, pitch and placement of the connection area 18 will vary depending on the configuration of the IC to be used and the process used to form the connection area 18. It is to be noted that while the term corrugated has been used to describe the shape of the connection area 18, the resulting projections and recesses need neither be parallel nor uniform. Further, the shape of the projections and recesses need not be a triangular pattern as shown in FIG. 1, but can be of any shape, such as square, circular or even irregular.

During curing, KQ material shrinks, mostly contracting on an upper surface 16a, to form an approximately 45-degree slope from the upper surface 16a to a lower surface 16b. After curing a layer of conductive material, such as gold, is deposited upon the slope between the upper and lower surfaces 16a and 16b on at least on the exposed edge of the area 18 of the dielectric 16. This, in essence, extends the ground plane 14 onto the area 18.

A portion of the dielectric layer 16 and substrate 12 is removed, using, for example, laser etching technology. In perhaps the preferred embodiment, a cut is made across the middle of the connection area 18, for example at dotted line 20. How much, if any of the dielectric layer 16 is cut may depend on a variety of factors, including the pitch of the connection in the IC used and the geometry of the connection area 18.

Figure 2:
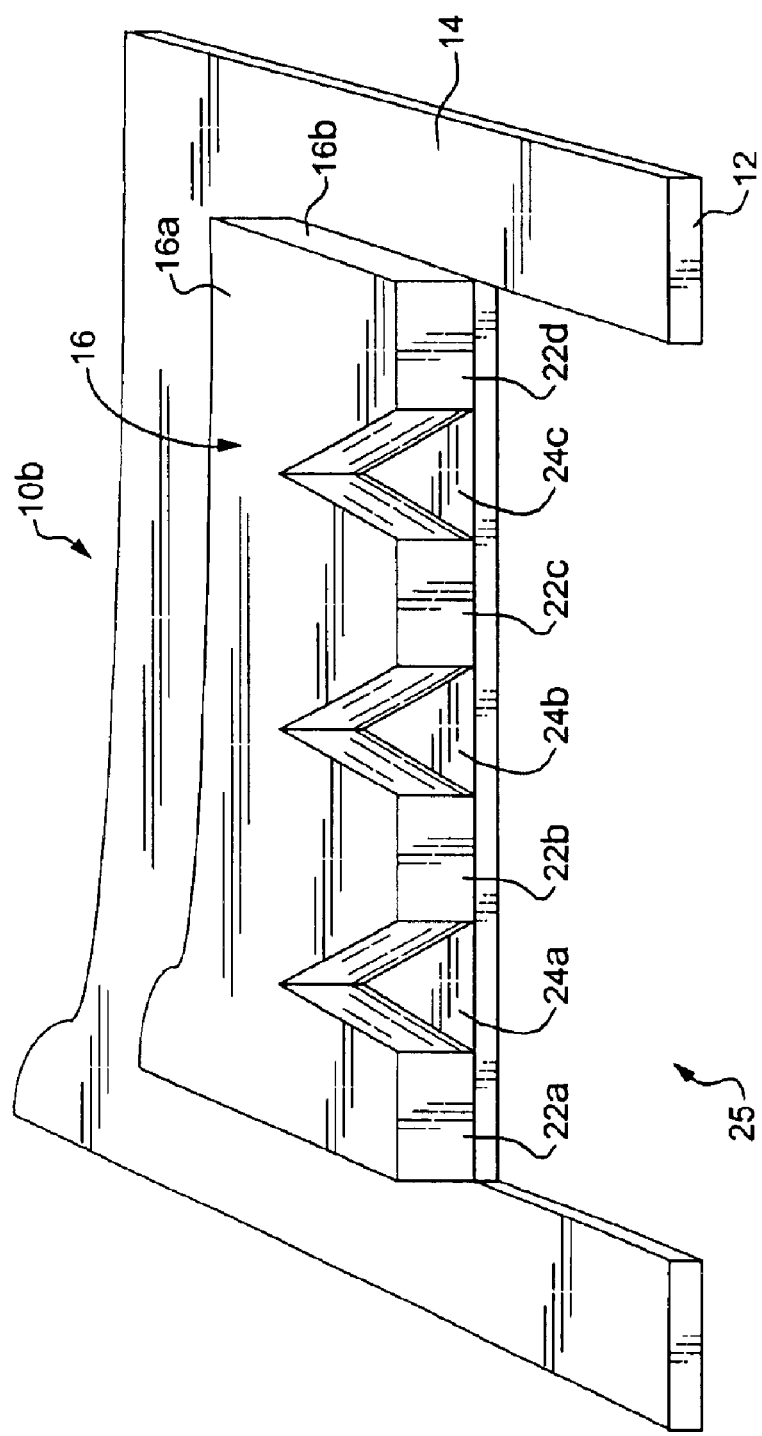
FIG. 2 is a conceptual diagram of a partially completed IC connection structure in accordance with the present invention.

FIG. 2 is a conceptual diagram of a partially completed IC connection structure 10b in accordance with the present invention. In the example shown in FIG. 2, the removed portion 25 of the dielectric layer 16 and substrate 12 corresponds in shape to the IC being used. This does not need be the case. In fact the portion removed may be of any shape selected by the circuit designer, so long as the IC can be mounted within the removed portion 25. In the example shown in FIG. 2, the cut forms discrete via-like ground connections, 24a, 24b, and 24c in the recesses of the connection area 18. Each ground connection 24n is isolated by flat non-conducting portions 22n.

It is preferable, but not necessary that the remaining portions of the connection area 18 have a length corresponding to the length of the side of the IC which will abut the connection area 18. As is known to those of ordinary skill in the art, with high frequency signals, shorter signal paths reduce signal degradation. Accordingly, it may be preferable that the removed portion 25 be dimensioned 1 mil or less larger than the dimensions of the IC to be used.

Figure 3:
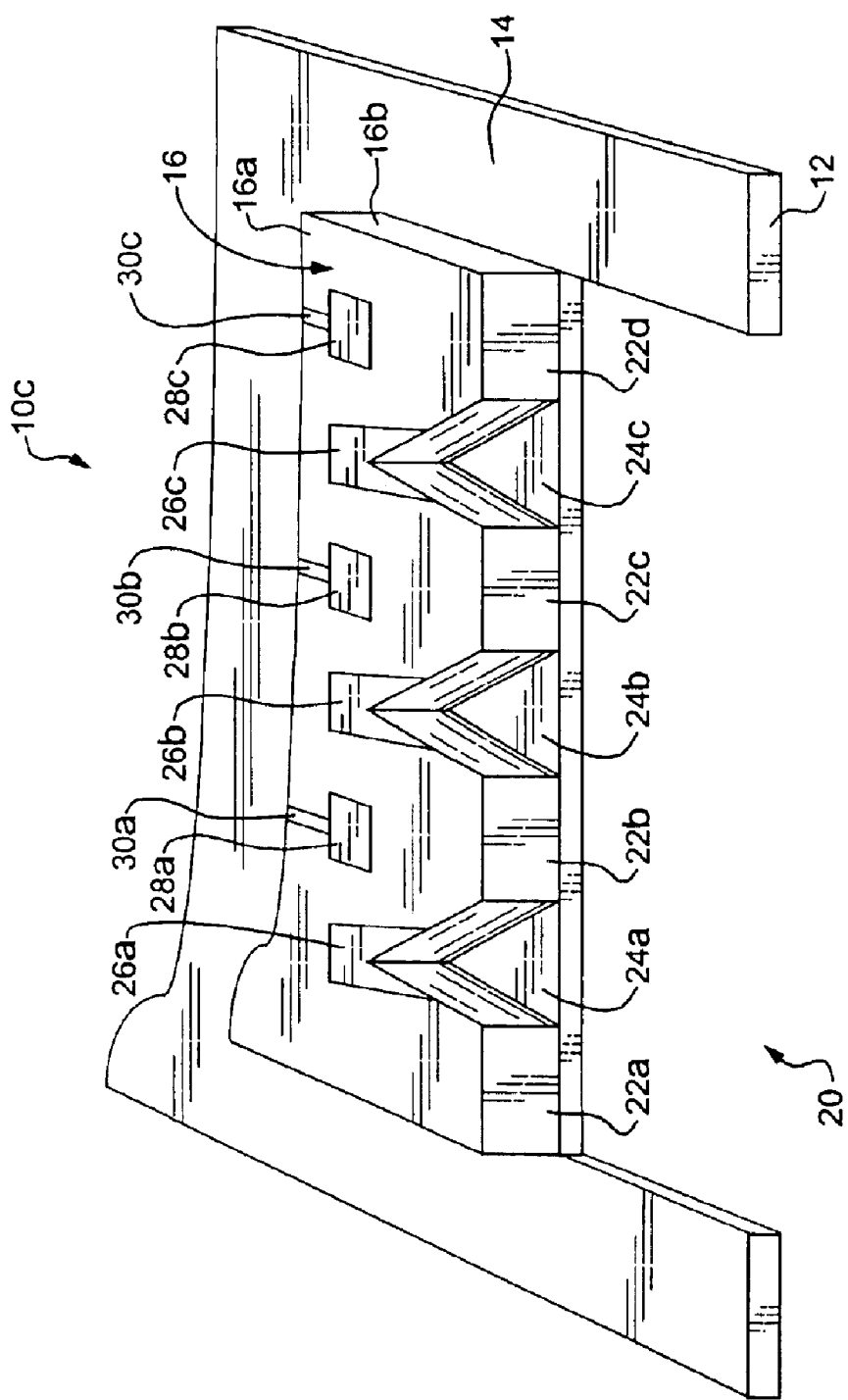
FIG. 3 is a conceptual diagram of an IC connection structure in accordance with the present invention.

FIG. 3 is a conceptual diagram of an IC connection structure in accordance with the present invention. Ground connection pads 26a–26c and signal connection pads 28a–28c are shown in FIG. 3. The ground connection pads 26n are in electrical connection with the ground connections 24n and may be formed of gold pads. Signal connection pads 28a through 28c are also shown. The signal connection pads 28n are connected to transmission lines 30a though 30c. Note that while rectangular connection pads 26n and 28n are portrayed, the pads can be of any shape chosen by the designer and may be simple extensions of the transmission lines 30n. The exact number of ground connection pads 26n and signal connection pads 28n will be determined by the desired number and type of connections between the IC to be used and the circuit to which the IC is to be connected.

The transmission lines 30n, may be of a variety of geometries. In perhaps the preferred embodiment, the transmission lines 30n are microstrips. The microstrips may be subsequently transitioned into a quasi-grounded coplanar waveguide (not shown). Microstrips are an open type of transmission line, other such open transmission lines include: coplanar waveguide, and coupled microstrip. Open transmission line may be transitioned to other geometries including: stripline, quasi-coaxial, and coupled stripline. It may also be preferable for the signal connections 28n to directly interface with such other transmission line structures, including a quasi-coaxial transmission line.

A quasi-coaxial transmission line uses an upper layer of KQ dielectric printed over the transmission line. The KQ dielectric is surrounded by a printed metal ground plane providing a completely surrounded structure. The metal ground plane might be grounded by using aspects of the present invention. For high frequency or high-speed digital signals, it may be beneficial for the transmission line 12 to exhibit a 50 ohm impedance.

Figure 4:
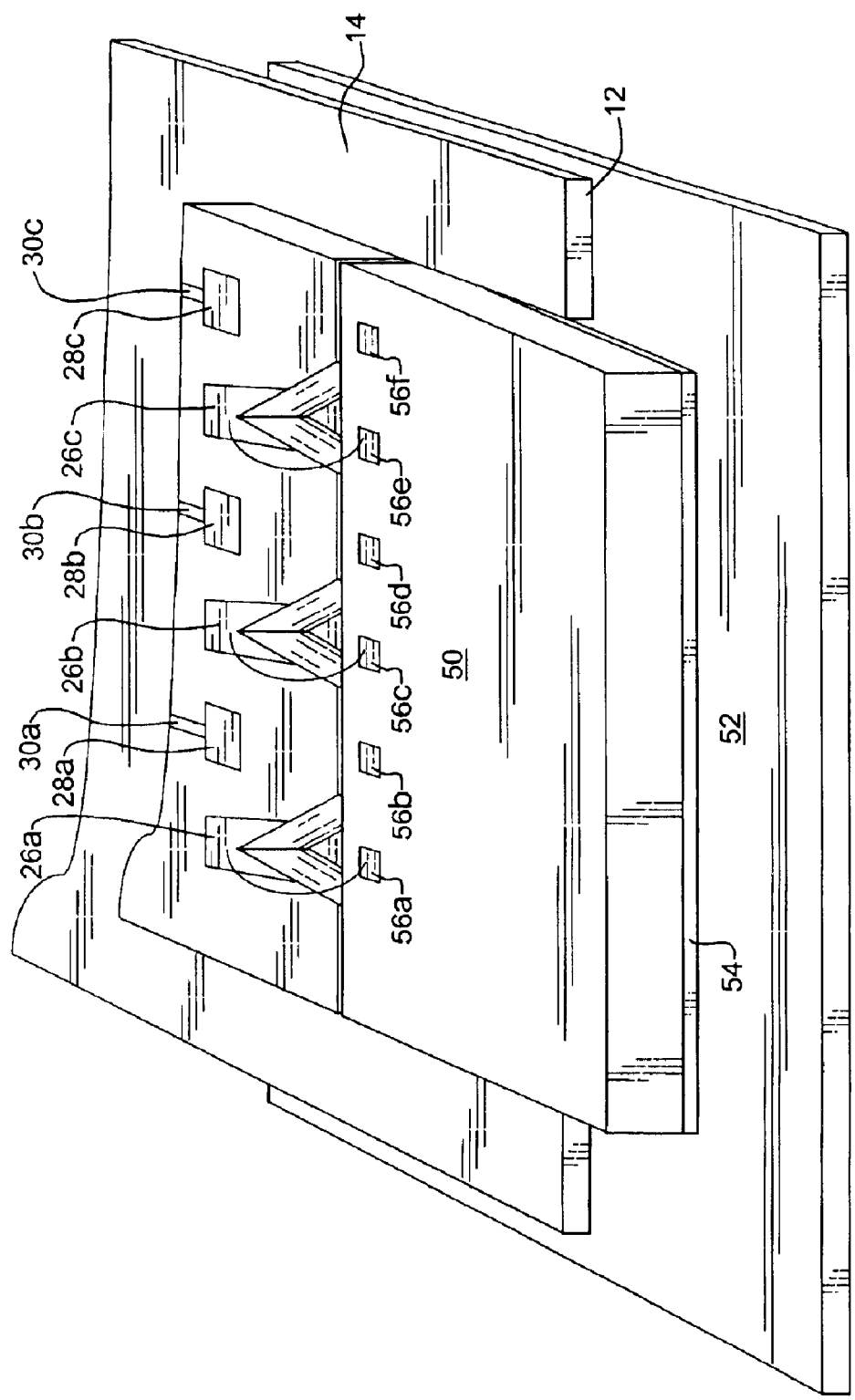
FIG. 4 is a conceptual diagram of a circuit board in accordance with the present invention.

FIG. 4 is a conceptual diagram of a circuit board 100 in accordance with the present invention. An IC 50 is mounted on a pedestal 52. An optional spacer 54 is shown that raises the top of the IC 50 to the height of the dielectric 16. By raising the top of the IC 50 to the height of the dielectric 16, the distances between connection points on the IC 50 and the dielectric 16 are minimized resulting in improved signals there between. The IC 50, pedestal 52 and spacer 54 are mounted to the substrate 14. Connection pads 56n on the IC are connected to connection pads 26n and 28n on the dielectric 16. The connections can be formed using any suitable technology, such as wire bonding.

Figure 5:
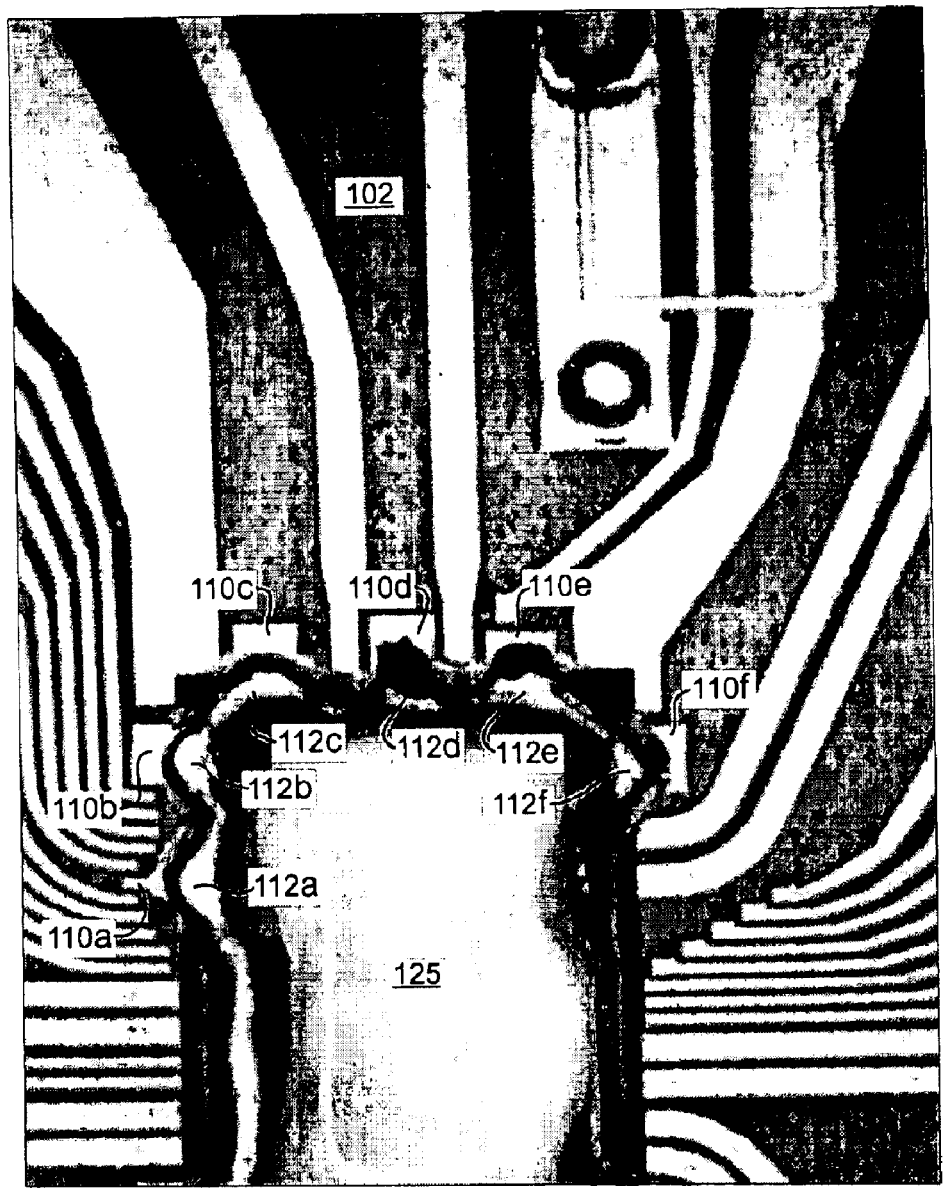
FIG. 5 is an image of a circuit board formed in accordance with teachings of the present invention.

FIG. 5 is an image of a circuit board 102 formed in accordance with teachings of the present invention. FIG. 5 is a plan view of the circuit board 102. The cut out portion 125 is surrounded by six visible ground connection pads 110a through 110f. Corresponding ground connections 112a through 112f are also visible. As is apparent in FIG. 5, while the ground connections have been described as being corrugated or triangular in shape, their actual shape will vary depending on many factors, including the accuracy of the formation process. Thus while some ground connections are triangular (such as 112f), other may be more rounded (such as 112b) or even irregular (such as 112e).

Although a few variations of the preferred embodiment of the present invention have been shown and described, it would be appreciated by those skilled in the art that changes may be made to the described invention without departing from the principles and spirit of the invention, the scope of which is defined in the claims and their equivalents.

What is claimed is:

1. A method of connecting an IC to a circuit on a substrate having a ground plane, the method comprising:

depositing a layer of thick film dielectric on the substrate, the layer forming having a connection area with at least two projections forming at least one recess in the vicinity of a desired location for the IC;

curing the thick film dielectric so as to form a bevel around an edge thereof;

depositing a conductive layer on the bevel of the connection area of the thick film dielectric, the conductive layer being in electrical communication with the ground plane;

forming at least one ground pad on top of the thick film dielectric, the at least one pad being electrically connected to the conductive layer in a recesses on the connection area;

cutting through the substrate to form a cut-out;

mounting the IC in the cut-out;

connecting ground leads of the IC to the at least one ground pad.

2. The method, as set forth in claim 1, wherein the layer of thick film dielectric is comprised of multiple layers of thick film dielectric.

3. The method, as set forth in claim 1, wherein the layer of thick film dielectric is comprised of KQ material.

4. The method, as set forth in claim 1, wherein the conductive layer comprises gold.

5. The method, as set forth in claim 1, wherein the ground pad comprises gold.

6. The method, as set form in claim 1, further comprising:
   terminating transmission lines in the layer of thick film dielectric near the connection area; and
   connecting leads of the IC to the transmission lines.

7. The method, as set forth in claim 6, further comprising:
   forming the transmission line using one of the following geometries: stripline, microstrip, coaxial, coplanar waveguide, wire above ground, suspended microstrip, coupled microstrip, slabline, coupled stripline, trough line and a quasi-grounded co-planar waveguide.

8. The method as set forth in claim 1, wherein the step of cutting further comprises cutting through the area formed by the thick film dielectric so as to electrically isolate the at least one recess from the remainder of the area.

9. The method, as set forth in claim 1, wherein the step of cutting is performed so as to create a cutout that 1 mil or less larger than the outside dimensions of the IC.

10. The method, as set forth in claim 1, wherein the step of mounting further comprises:
    fabricating a base that supports the IC in the cutout wherein the top of the IC is level with the top of the layer of thick film dielectric.

11. A microcircuit comprising:
    an IC;
    a substrate having a cut out to receive the IC;
    a ground plane formed on the substrate;
    a thick film dielectric structure upon which is printed a plurality of transmission lines, the dielectric structure abutting the cut out with a connection area with at least two projections forming at least one recess, the recess having a conductive layer thereon, the conductive layer in electrical communication with the ground plane;
    a conductive pad on top of the dielectric structure in electrical communication with the conductive layer in the recess; and
    an electrical connection between the IC and the conductive pad grounding the IC.

12. A microcircuit, as set forth in claim 11, wherein the transmission lines have a geometry selected from a group comprising: stripline, microstrip, coaxial, coplanar waveguide, wire above ground, suspended microstrip, coupled microstrip, slabline, coupled stripline, trough line and a quasi-grounded co-planar waveguide.

13. A microcircuit, as set forth in claim 11, wherein the dielectric structure comprises a plurality of layers.

14. A microcircuit, as set forth in claim 11, wherein the dielectric structure is comprised of KQ material.

15. A microcircuit, as set forth in claim 11, wherein the conductive layer is comprised of gold.

16. A microcircuit, as set forth in claim 11, wherein at least one of the transmission lines terminate neat the connection area.

17. A microcircuit, as set forth in claim 11, wherein the dielectric area has at least three projections forming at least two isolated recesses.

18. A microcircuit, as set forth in claim 11, wherein the IC is secured in the cut out such that an edge of the IC is 1 mil or less apart from an edge of the dielectric structure.

19. A microcircuit, as set forth in claim 11, further comprising:
    a base to support the IC in the cut out, the base being wider or longer than the cut out and secured to the underside of the substrate.

20. A microcircuit, as set forth in claim 19, wherein the base supports the IC such that a top surface of the IC is level with the ground pads.

* * * * *